United States Patent
Lu

[11] Patent Number: 6,136,698
[45] Date of Patent: Oct. 24, 2000

[54] METHOD OF INCREASING CONTACT AREA OF A CONTACT WINDOW

[75] Inventor: Jau-Hone Lu, Hsinchu Hsien, Taiwan

[73] Assignee: United Integrated Circuits Corp, Hsinchu, Taiwan

[21] Appl. No.: 09/326,379

[22] Filed: Jun. 4, 1999

[51] Int. Cl.[7] .................. H01L 21/283; H01L 21/306
[52] U.S. Cl. .................. 438/649; 438/627; 438/643; 438/648; 438/664; 438/682; 438/724
[58] Field of Search .................. 438/649, 303, 438/586, 664, 682, 627, 634, 643, 648, 720, 724, 302, 305, 400, 439, 424, 425; 257/382, 384, 368, 383, 388, 900, 754, 770, 588, 592, 370

[56] References Cited

U.S. PATENT DOCUMENTS

| | | | |
|---|---|---|---|
| 4,901,134 | 2/1990 | Misawa et al. | 257/754 |
| 5,567,651 | 10/1996 | Berti et al. | 438/303 |
| 5,739,573 | 4/1998 | Kawaguchi | 438/305 |
| 5,744,855 | 4/1998 | Maki et al. | 257/588 |
| 5,750,438 | 5/1998 | Hsue et al. | 438/627 |

*Primary Examiner*—Matthew Smith
*Assistant Examiner*—Igwe Uma Anya
*Attorney, Agent, or Firm*—J. C. Patents; Jiawei Huang

[57] ABSTRACT

A method is provided to increase the contact area of a contact window. In this method, the contact area is mainly increased by a concavity which is formed by first forming a thin oxide layer in the contact region using local oxidation, then further by removing the thin oxide layer. Additionally, in order to reduce the contact resistance, a metal oxide layer can be selectively formed at the contact interface.

16 Claims, 2 Drawing Sheets

METHOD OF INCREASING CONTACT AREA OF A CONTACT WINDOW

BACKGROUND OF THE INVENTION

1. Field of the Invention

The invention relates in general to a method of fabricating a semiconductor device, and more particularly, to a method of increasing the contact area of contact window using local oxidization.

2. Description of the Related Art

At present, in many highly integrated semiconductor devices, more than two levels of interconnecting metal layers are necessary to form a three dimensional network, called mutilevel metal interconnects (MLM), because of the increasing integration density of semiconductor devices. In the first level, the metal line is commonly polysilicon or metal, which can be electrically connected by contact plugs to a device.

In the conventional method, first the transistor is formed in the active region insulated by a field oxide (FOX). Then, the substrate is covered by an insulator, and the contact plug is formed in the insulator and connects to the source/drain of the transistor.

In the contact interface between contact plug and substrate, junction resistance induced by the contact of different materials results in slowing the transmission of the electric current. The larger the junction resistance and the longer the resistance-capacitance time delay, the slower the electric current transmits.

In the integrated circuit technology at the deep sub-micron level, the planar area which can be used by the contact plug is continuously decreasing and the contact area of the contact window is decreasing, as well. Thus, in this situation of increasing junction resistance, a method which can promote the operation quality of the device, reduce the contact resistance and resistance-capacitance time delay, and effectively increase the contact area without increasing the planar area is demanded.

Therefore, the purpose of the invention is to provide a method which can meet the requirements described above, without adding extra steps to the process.

SUMMARY OF THE INVENTION

The invention provides a method of increasing the contact area of a contact window.

In the invention, a substrate is patterned with a mask to define the field oxide region, the active region and the local oxide region. The active region is surrounded by the field oxide region. In the subsequent oxidation process, the field oxide region and the local oxide region are oxidized. Thus, the field oxide region is transformed into a field oxide layer for insulating devices and the local oxide region is transformed into a local oxide layer. Then, the mask layer and the local oxide layer are removed, so that a concavity is formed and the contact area is increased. The concavity results from removing the oxidized part of the substrate in the contact window. Thus, a concavity appears when the oxidized part is removed from the local oxide layer. In the subsequent process, the fabrication of a device such as a transistor is undertaken. A source/drain region in the substrate is formed, and then a self-aligned process forms a silicide layer on the surface of the source/drain region to reduce the contact resistance. Finally, an insulator layer and a contact plug are formed on the substrate. The contact plug is located within the insulator layer and couples with the substrate.

The invention mainly forms a concavity in the contact window by removing the local oxide region of the substrate formed in the local oxidation process. The concavity increases the contact area and reduces the contact resistance, but does not increase the planar area of the contact window.

DESCRIPTION OF THE PREFERRED EMBODIMENTS

Figure 1A:
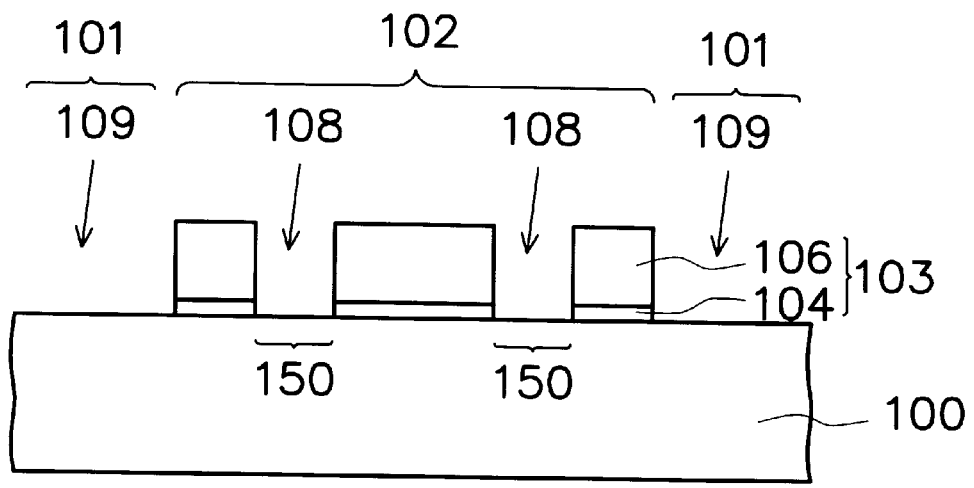
FIGS. 1A to 1E are schematic, cross-sectional views showing a process for increasing the contact area of a contact window in a preferred embodiment according to the invention.

In FIG. 1A, a substrate 100 is provided, and a mask layer 103 is formed on the substrate 100 to define a field oxide region 101 and an active region 102. The active region 102 is surrounded by the field oxide region 101. The mask layer has openings 108 and 109. The contact window 150 exposing the substrate 100 is a position reserved for a contact plug and is directly below the opening 108. Additionally, the opening 109 is in the field oxide region 101.

A method for forming the mask layer 103 is, for example, first forming a silicon oxide layer 104 by silicon oxidation on the substrate 100 and then depositing a silicon nitride layer 106 by chemical vapor deposition (CVD) in order. Then, openings 108 and 109 are formed using photolithography and etching to pattern the mask layer 103 and to define the field oxide region 101, the active region 102, and the contact window 150 in the active region 102.

Figure 1B:
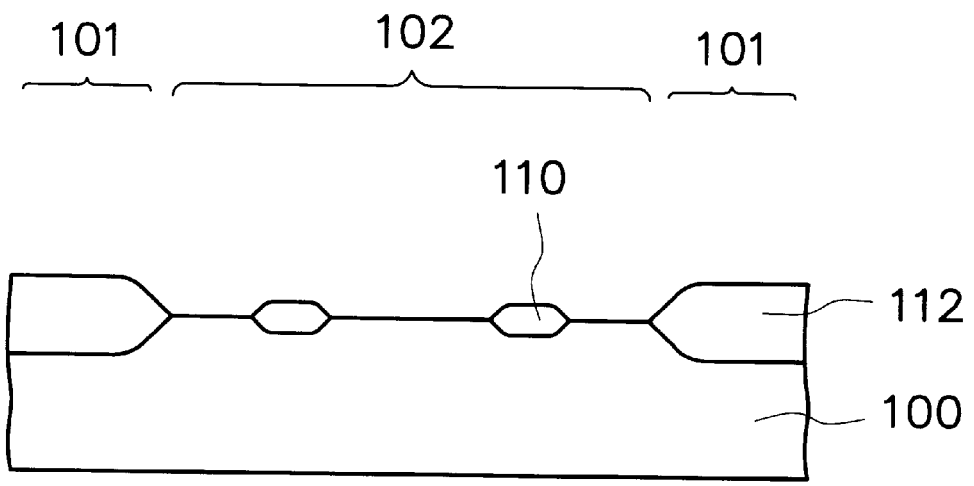

In FIG. 1B, the exposed field oxide region 101 and contact window 150 on the substrate 100 are oxidized into silicon oxide layers, including the field oxide layer 112 for insulating devices and the local oxide layer 110, respectively.

Since the open area of the opening 108 is much smaller than the opening 109, the smaller area of the opening 108 affects the local oxidation. Thus, the local oxide layer 110 is much thinner than the field oxide layer 112.

Figure 1C:
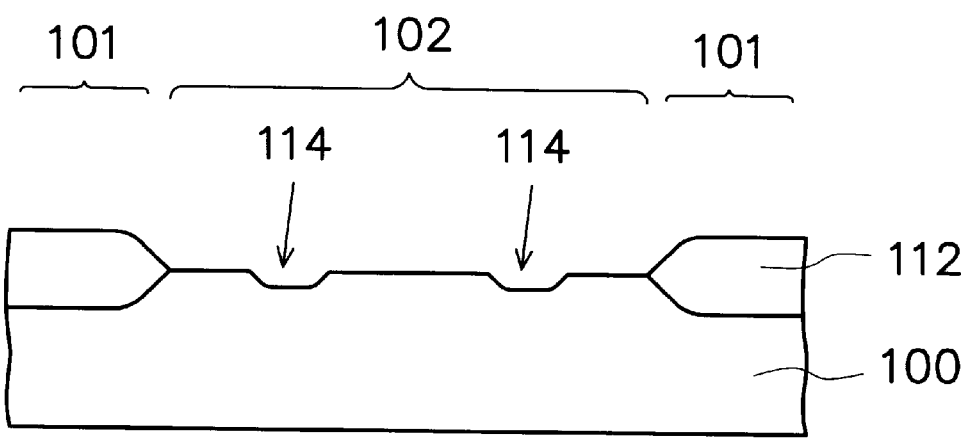

In FIGS. 1B and 1C, the mask layer 103 and the local oxide layer 110 are removed, for example, by wet etching to form a concavity 114 in the contact window 150.

The concavity 114 results from the oxidation in the silicon-substrate 100. Since silicon is a reactant, the oxidation occurs in the local oxide layer 110 and consumes some silicon in the substrate 100, and the concavity 114 is formed. In addition, the size of the concavity 114 is controllable by the size of the opening 108; thus the increase of the contact area is controllable, as well.

When the local oxide layer 110 is removed, some of the field oxide layer 112 on the surface is also removed. However, the field oxide layer 112 is much thicker than the local oxide layer 110. Thus, the thinning does not affect the insulation ability of the field oxide layer 112, even though some material is removed from the surface of the field oxide layer 112. Alternatively, the subsequent processes still include removing oxide layers such as portions of a gate oxide layer, a sacrificial oxide layer, etc. Therefore, the local oxide layer 110 can be removed with these subsequently formed oxide layers as long as the removal does not affect the subsequent processes.

Figure 1D:
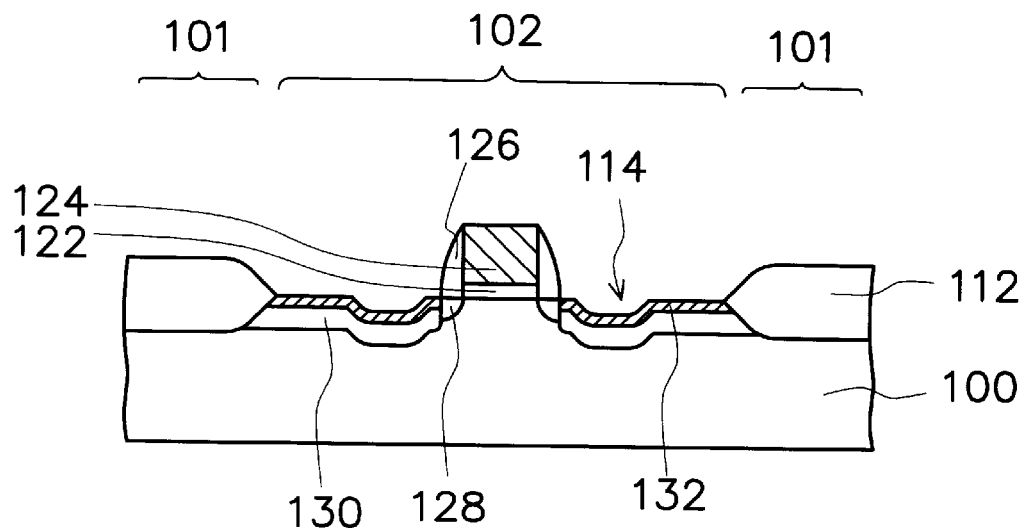

In FIG. 1D, an active device such as a metal oxide semiconductor (MOS) and a conductive region such as a source/drain region 130 are formed. Typically, the MOS device consists of the gate oxide layer 122, the gate including the gate conductive layer 124 and the spacer 126, the lightly doped drain (LDD) 128, and the source/drain region 130 in the contact window 150. The fabrication of MOS is a well-known technology for people in this field; it is therefore not described here.

As shown in FIG. 1D, whether the source/drain region 130 needs to form a silicide layer 132 on the surface is dependent upon the product requirements such as cost, etc. This process is completely optional. The method to form a silicide layer 132 is, for example, a self-aligned process. It can be a titanium silicide or a cobalt silicide layer.

Figure 1E:
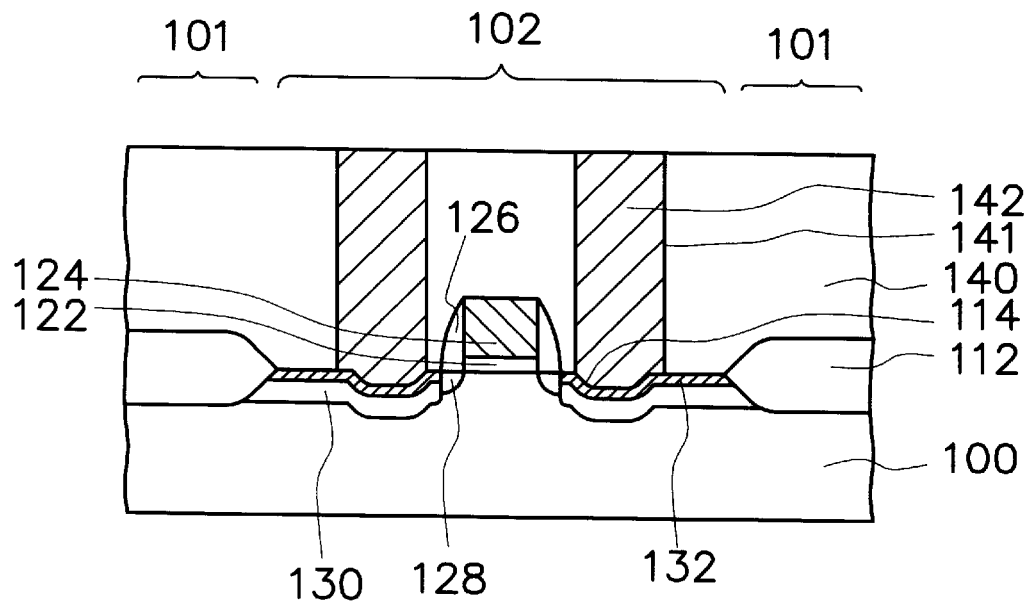

In FIG. 1E, an insulator layer 140 is, for example, a silicon oxide layer formed by chemical vapor deposition. A window opening 141 is formed within the insulator layer 140 to expose the substrate 100 (the silicide layer 132 or the source/drain region 130) in the contact window 150 by, for example, conventional photolithography and etching. Then, the window opening 141 is filled with a conductive layer such as a doped polysilicon layer or a metal layer to form a conductive contact plug 142.

Since the concavity 114 is formed in the contact window 150, the contact area of the contact window can increase effectively and reduce the contact resistance, but the planar area of the contact window 150 does not increase.

In conclusion, when the insulating field oxide layer is formed, the contact window is formed into a local oxide layer. After removing the local oxide layer, a concavity in the contact window is created, so that the contact area of the contact window increases and the contact resistance is reduced.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of increasing contact area of a contact window, which method is suitable for a substrate with a contact window and comprises the steps of:

performing a local oxidation process to oxidize a portion of the substrate and form a local oxide layer within the substrate exposed by the contact window; and removing the local oxide layer to form a concavity within the substrate exposed by the contact window.

2. The method of claim 1, further comprising formation of a silicide layer in the contact window after removing the local oxide layer.

3. The method of claim 2, wherein the formation of the silicide layer comprises a self-aligned process.

4. A method of fabricating a semiconductor device, comprising:

providing a substrate;

forming a mask layer on the substrate to define a field oxide region, an active region, and a contact window in the active region, wherein the field oxide region surrounds the active region;

performing a local oxidation process to oxidize a portion of the substrate and form a local oxide layer within the substrate exposed by the contact window;

removing the local oxide layer to form a concavity within the substrate exposed by the contact window; and forming a conductive contact plug on the substrate and coupling it with the substrate exposed by the contact window.

5. The method of claim 4, wherein the mask layer comprises a silicon oxide layer and a silicon nitride layer, in that order.

6. The method of claim 4, further comprising a step of forming a conductive region in the active region after removing the mask layer and the local oxide layer.

7. The method of claim 6, wherein the conductive region comprises a source/drain region.

8. The method of claim 6, further comprising a step of forming a silicide layer on the substrate exposed by the contact window after forming a source/drain region.

9. The method of claim 8, wherein the formation of the silicide layer comprises a self-aligned process.

10. The method of claim 9, wherein the silicide layer comprises a silicide titanium layer.

11. The method of claim 9, wherein the silicide layer comprises a silicide cobalt layer.

12. A method of fabricating a semiconductor device, comprising:

providing a substrate;

forming a mask layer on the substrate to define a field oxide region, an active region, and a contact window of the active region, wherein the field oxide region surrounds the active region;

performing a local oxidation process to oxidize a portion of the substrate exposed by the contact window to form a concavity within the substrate exposed by the contact window, and forming a local oxide layer in the contact window and a field oxide layer within the substrate in the field oxide region;

removing the mask layer and the local oxide layer;

forming a transistor within the substrate in the active region, wherein the transistor comprises at least a source/drain region within the substrate exposed by the contact window;

forming a silicide layer on the source/drain region; and forming an insulator layer and a contact plug, the contact plug being within the insulator layer and coupling with the silicide layer.

13. The method of claim 12, wherein the mask layer comprises a silicon oxide layer and a silicon nitride layer, in that order.

14. The method of claim 12, wherein the formation the silicide layer comprises a self-aligned process.

15. The method of claim 14, wherein the silicide layer comprises a silicide titanium layer.

16. The method of claim 14, wherein the silicide layer comprises a silicide cobalt layer.

* * * * *